United States Patent
Zheng et al.

(10) Patent No.: US 11,515,499 B2
(45) Date of Patent: Nov. 29, 2022

(54) OLED ELEMENT, DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Kening Zheng, Beijing (CN); Yingchang Gao, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 520 days.

(21) Appl. No.: 16/562,568

(22) Filed: Sep. 6, 2019

(65) Prior Publication Data
US 2020/0220096 A1 Jul. 9, 2020

(30) Foreign Application Priority Data
Jan. 8, 2019 (CN) .......................... 201910015737.3

(51) Int. Cl.
*H01L 51/50* (2006.01)
*H01L 51/00* (2006.01)
(52) U.S. Cl.
CPC ...... *H01L 51/5072* (2013.01); *H01L 51/0077* (2013.01); *H01L 51/5056* (2013.01)
(58) Field of Classification Search
CPC ............ H01L 51/5072; H01L 51/0077; H01L 51/5056; H01L 51/0053; H01L 51/50; H01L 51/5076; H01L 51/506
See application file for complete search history.

(56) References Cited

U.S. PATENT DOCUMENTS

| 2003/0111666 A1* | 6/2003 | Nishi ................. H01L 51/0051 257/79 |
| 2012/0319089 A1 | 12/2012 | Shin et al. |
| 2017/0125695 A1 | 5/2017 | Pentlehner et al. |
| 2017/0352823 A1 | 12/2017 | Kim et al. |

FOREIGN PATENT DOCUMENTS

| CN | 1422104 A | 6/2003 |
| CN | 102832353 A | 12/2012 |
| CN | 107464886 A | 12/2017 |

OTHER PUBLICATIONS

Chinese Office Action for corresponding 201910015737.3 dated Aug. 14, 2020.

* cited by examiner

*Primary Examiner* — Syed I Gheyas
(74) *Attorney, Agent, or Firm* — ArentFox Schiff LLP; Michael Fainberg (57) ABSTRACT

The disclosure discloses an OLED element, a display panel, and a display device. The OLED element includes an anode, a light-emitting layer, a cathode stacked, and at least one of following components: an electric charge transfer and hole transmission component located between the anode and the light-emitting layer, where the electric charge transfer and hole transmission component includes a first light-induced electron transfer material and a hole transmission material; or an electric charge transfer and electron transmission component located between the cathode and the light-emitting layer, where the electric charge transfer and electron transmission component includes a second light-induced electron transfer material and an electron transmission material.

18 Claims, 4 Drawing Sheets

OLED ELEMENT, DISPLAY PANEL, AND DISPLAY DEVICE

CROSS-REFERENCE TO RELATED APPLICATION

This application claims priority to Chinese Patent Application No. 201910015737.3, filed on Jan. 8, 2019, which is hereby incorporated by reference in its entirety.

FIELD

The present disclosure relates to the field of OLED elements, and particularly to an OLED element, a display panel, and a display device.

BACKGROUND

An Organic Light-Emitting Diode (OLED) with low driving voltage, high light-emission brightness, a wide angle of view, a high response speed, a simple fabrication process, etc., is promising among the next generation of display technologies, and preferred among environmentally friendly lighting light sources at present.

SUMMARY

Embodiments of the disclosure disclose an OLED element, a display panel, and a display device.

There are the following technical solutions according to the embodiments of the disclosure.

An embodiment of the disclosure provides an OLED element including an anode, a light-emitting layer, a cathode stacked in that order, an at least one of following components: an electric charge transfer and hole transmission component located between the anode and the light-emitting layer, where the electric charge transfer and hole transmission component includes a first light-induced electron transfer material and a hole transmission material, the first light-induced electron transfer material is configured to transfer first electric charges between first molecules of the first light-induced electron transfer material and second molecules of the hole transmission material upon being excited by light, the first light-induced electron transfer material includes electron acceptors, and the hole transmission material includes electron donors; or an electric charge transfer and electron transmission component located between the cathode and the light-emitting layer, wherein the electric charge transfer and electron transmission component includes a second light-induced electron transfer material and an electron transmission material, the second light-induced electron transfer material is configured to transfer second electric charges between third molecules of the second light-induced electron transfer material and fourth molecules of the electron transmission material upon being excited by light, the second light-induced electron transfer material includes electron donors, and the electron transmission material includes electron acceptors.

In some embodiments, the electric charge transfer and hole transmission component includes a first electron transfer layer formed of the first light-induced electron transfer material, and a hole transmission layer formed of the hole transmission material, and the first electron transfer layer is located between the anode and the hole transmission layer; or the electric charge transfer and hole transmission component is a single-layer component formed of the first light-induced electron transfer material and the hole transmission material.

In some embodiments, the electric charge transfer and electron transmission component includes a second electron transfer layer formed of the second light-induced electron transfer material, and an electron transmission layer formed of the electron transmission material, and the second electron transfer layer is located between the cathode and the electron transmission layer; or the electric charge transfer and electron transmission component is a single-layer component formed of the second light-induced electron transfer material and the electron transmission material.

In some embodiments, laser of the first light-induced electron transfer material includes visible light; and laser of the second light-induced electron transfer material includes visible light.

In some embodiments, the first light-induced electron transfer material is a photosensitive macromolecule material; and the second light-induced electron transfer material is a photosensitive macromolecule material.

In some embodiments, the first molecules of the first light-induced electron transfer material include a conjugate system; and the third molecules of the second light-induced electron transfer material include a conjugate system.

In some embodiments, the first light-induced electron transfer material is selected from at least one of benzoylimino and a derivative thereof, porphyrin and a derivative thereof, or perylene and a derivative thereof; and the second light-induced electron transfer material is selected from at least one of benzoylimino and a derivative thereof, porphyrin and a derivative thereof, or perylene and a derivative thereof.

In some embodiments, the OLED element further includes at least one of following barrier layers: an electronic barrier layer located between the light-emitting layer and the electric charge transfer and hole transmission component; or a hole barrier layer located between the light-emitting layer and the electric charge transfer and electron transmission component.

An embodiment of the disclosure provides a display panel including the OLED elements according to any one of the technical solutions above.

An embodiment of the disclosure provides a display device including the display panel according to the technical solution above.

DETAILED DESCRIPTION OF THE EMBODIMENTS

The technical solutions according to the embodiments of the disclosure will be described below clearly and fully with reference to the drawings in the embodiments of the disclosure. Apparently the embodiments to be described are only a part but all of the embodiments of the disclosure. Based upon the embodiments here of the disclosure, all of other embodiments which can occur to those ordinarily skilled in the art without any inventive effort shall come into the claimed scope of the disclosure.

As illustrated in FIG. 1 to FIG. 3, and FIG. 5 to FIG. 8, an embodiment of the disclosure provides an OLED element including an anode 1, a light-emitting layer 3, and a cathode 2 stacked in that order.

And the OLED element further includes at least one of an electric charge transfer and hole transmission 4, or an electric charge transfer and electron transmission component 5.

The electric charge transfer and hole transmission component 4 is located between the anode 1 and the light-emitting layer 3, where the electric charge transfer and hole transmission component 4 includes a first light-induced electron transfer material (e.g., a first electron transfer layer 42) and a hole transmission material (e.g., a hole transmission layer 41), the first light-induced electron transfer material is configured to transfer first electric charges between first molecules of the first light-induced electron transfer material and second molecules of the hole transmission material upon being excited by light, the first light-induced electron transfer material (e.g., the first electron transfer layer 42) includes electron acceptors, and the hole transmission material (e.g., the hole transmission layer 41) includes electron donors.

The electric charge transfer and electron transmission component 5 is located between the cathode 2 and the light-emitting layer 3, where the electric charge transfer and electron transmission component includes a second light-induced electron transfer material (e.g., a second electron transfer layer 52) and an electron transmission material (e.g., an electron transmission layer 51), the second light-induced electron transfer material is configured to transfer second electric charges between third molecules of the second light-induced electron transfer material and fourth molecules of the electron transmission material upon being excited by light, the second light-induced electron transfer material (e.g., the second electron transfer layer 52) includes electron donors, and the electron transmission material (e.g., the electron transmission layer 51) includes electron acceptors.

Figure 3:
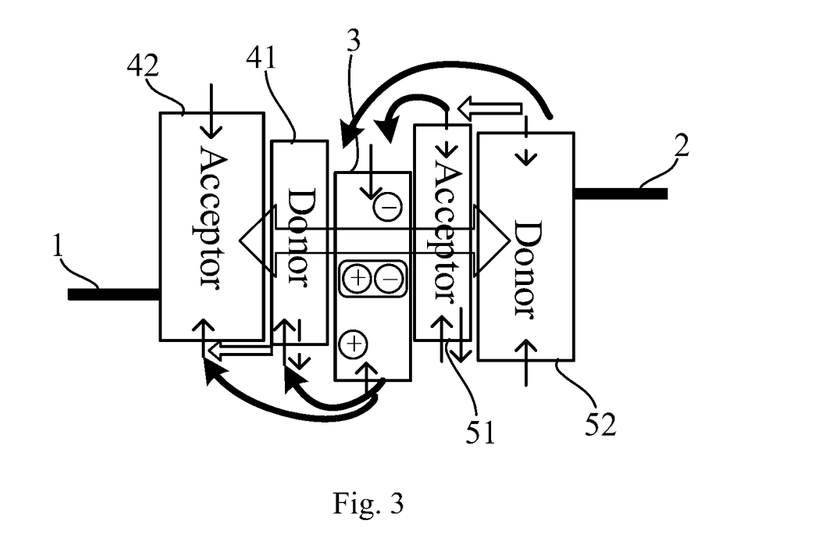
FIG. 3 is a schematic diagram of a light-emission principle of the OLED element in FIG. 2.

In some embodiments, as illustrated in FIG. 3, when the OLED element is powered on and emits light in the electric charge transfer and hole transmission component 4, the first light-induced electron transfer material (e.g., the first electron transfer layer 42) absorbs the emitted light, and the first electric charges are transferred between the first molecules of the first light-induced electron transfer material and the second molecules of the hole transmission material (e.g., the hole transmission layer 41), so that holes which may move freely are generated. That is, more holes are generated from HTL+, and these holes are transmitted to the light-emitting layer (EML) 3 thermally or electrically (under the action of voltage and/or heat of the OLED element itself), and recombined with electrons to emit light.

In some embodiments, as illustrated in FIG. 3, when the OLED element is powered on and emits light, in the electric charge transfer and electron transmission component 5, the second light-induced electron transfer material (e.g., the second electron transfer layer 52) absorbs the emitted light, and the second electric charges are transferred between the third molecules of the second light-induced electron transfer material and the fourth molecules of the electron transmission material (e.g., the electron transmission layer 51), so that holes which may move freely are generated, that is, more electrons are generated from ETL−, and these electrons are transmitted to the light-emitting layer (EML) 3 thermally or electrically (under the action of voltage and/or heat of the OLED element itself), and recombined with holes to emit light.

In summary, the OLED element above is arranged with the electric charge transfer and hole transmission component 4 and/or the electric charge transfer and electron transmission component 5 so that light-induced electron transfer may be induced in the component using the light, emitted by the OLED element, which is not utilized in effect, to thereby generate holes or electrons which can be transmitted respectively to the light-emitting layer 3, and recombined into excitons with electrons or holes so as to improve the concentration of carriers in the element, and the light-emission brightness and efficiency of the element.

Furthermore the light emitted by the OLED element above includes light emitted when intrinsic carriers are recombined into excitons in the element which is powered on, and light emitted when new excitons are generated due to light-induced electron transfer between molecules, where the former excitons are generated in a different mechanism and in a different period of time from the latter excitons. In some embodiments, the excitons generated due to light-induced electron transfer are generated after the intrinsic carriers in the element are recombined into excitons, and light is further emitted as a result of de-excitation and radiation in a different period of time from the excitons generated directly from the intrinsic carriers in the element, so the concentration of excitons in the OLED element can be improved, but also the concentration of excitons can be avoided from being quenched, to thereby alleviate the light-emission efficiency of the element from falling down, and improve the light-emission stability of the element, that is, dropping of the light-emission brightness of the OLED element can be slowed down given a current density.

Still furthermore a real transmission condition of carriers can be determined according to a relative difference in mobility between holes and electrons in the OLED element so that one of the electric charge transfer and hole transmission component 4 and the electric charge transfer and electron transmission component 5 can be selectively added to the OLED element to thereby balance transmission of the carriers (the holes and the electrons) so as to lower start voltage of the element, and to further improve the light-emission brightness and efficiency of the element.

Figure 4:
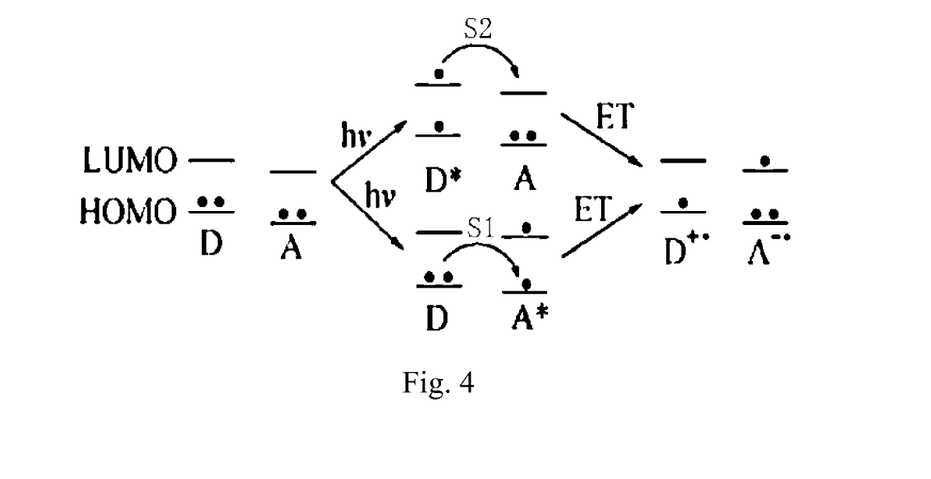
FIG. 4 is a schematic diagram of a principle for light-induced transfer of electric charges between molecules.

FIG. 4 is a schematic principle diagram of light-induced transfer of electric charges between molecules of the electric charge transfer and hole transmission component 4 and the electric charge transfer and electron transmission component 5, where D represents an electron donor, and A represents an electron acceptor.

In some embodiments, in the electric charge transfer and hole transmission component 4, the first light-induced electron transfer material includes electron acceptors A, and the hole transmission material includes electron donors D. S1 represents light-induced electron transfer. That is, an electron at the HOMO energy level of an electron acceptor A jumps to the LUMO energy level, and an electron at the HOMO energy level of an electron donor D jumps to the HOMO energy level of the electron acceptor A, upon being excited by light (hv), thus resulting in a hole D+.

In some embodiments, in the electric charge transfer and electron transmission component 5, the second light-induced electron transfer material includes electron donors D, and the electron transmission material includes electron acceptors A. S2 represents light-induced electron transfer. That is, an electron at the HOMO energy level of an electron donor D jumps to the LUMO energy level, and an electron at the LUMO energy level of the electron donor D umps to the LUMO energy level of the electron acceptor A, upon being excited by light (hv), thus resulting in an electron A−. The HOMO energy level represents the Highest Occupied Molecular Orbital, and the LUMO energy level represents the Lowest Unoccupied Molecular Orbital.

In some embodiments, in the electric charge transfer and hole transmission component 4, in order to improve the transfer efficiency of the electric charges, and the transmission efficiency of the holes to the light-emitting layer 3, the HOMO energy level of an acceptor (the first light-induced electron transfer material), and the HOMO energy level of a donor (the hole transmission material) may be configured to match with each other, that is, the energy levels are identical.

In some embodiments, in the electric charge transfer and electron transmission component 5, in order to improve the transfer efficiency of the electric charges, and the transmission efficiency of the electrons to the light-emitting layer 3, the LUMO energy level of an acceptor (the electron transmission material), and the LUMO energy level of a donor (the second light-induced electron transfer material) can be configured to match with each other, that is, the energy levels are identical.

In some embodiments, there may be different structural forms of the electric charge transfer and hole transmission component 4.

Figure 2:
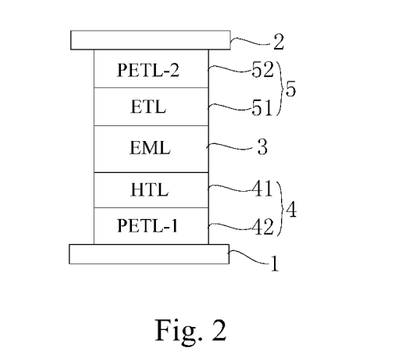
FIG. 2 is a schematic structural diagram of a second OLED element according to an embodiment of the disclosure.

For example, as illustrated in FIG. 2, the electric charge transfer and hole transmission component 4 includes the first electron transfer layer (PETL-1) 42 formed of the first light-induced electron transfer material, and the hole transmission layer (HTL) 41 formed of the hole transmission material, where the first electron transfer layer 42 is located between the anode 1 and the hole transmission layer 41. That is, the first light-induced electron transfer material and the hole transmission material are vapor-plated separately to form two separate layers of the component.

Figure 1:
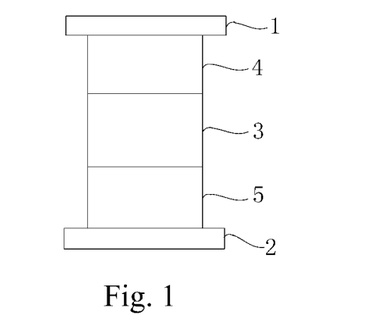
FIG. 1 is a schematic structural diagram of a first OLED element according to an embodiment of the disclosure.

Alternatively as illustrated in FIG. 1, the electric charge transfer and hole transmission component 4 is a single-layer component formed of the first light-induced electron transfer material and the hole transmission material, that is, the first light-induced electron transfer material and the hole transmission material are doped and vapor-plated to form a uni-layer component.

In some embodiments, there may be also different structural forms of the electric charge transfer and electron transmission component 5.

For example, as illustrated in FIG. 2, the electric charge transfer and electron transmission component 5 includes the second electron transfer layer (PETL-2) 52 formed of the second light-induced electron transfer material, and the electron transmission layer (ETL) 51 formed of the electron transmission material, where the second electron transfer layer 52 is located between the cathode 2 and the electron transmission layer 51. That is, the second electron transfer material and the electron transmission material are vapor-plated separately to form two separate layers of the component.

Alternatively as illustrated in FIG. 1, the electric charge transfer and electron transmission component 5 is a single-layer component formed of the second light-induced electron transfer material and the electron transmission material. That is, the second light-induced electron transfer material and the electron transmission material are doped and vapor-plated to form a uni-layer component.

Figure 5:
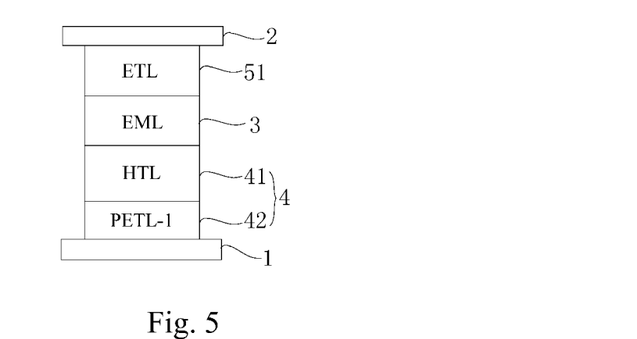
FIG. 5 is a schematic structural diagram of a third OLED element according to an embodiment of the disclosure.
Figure 6:
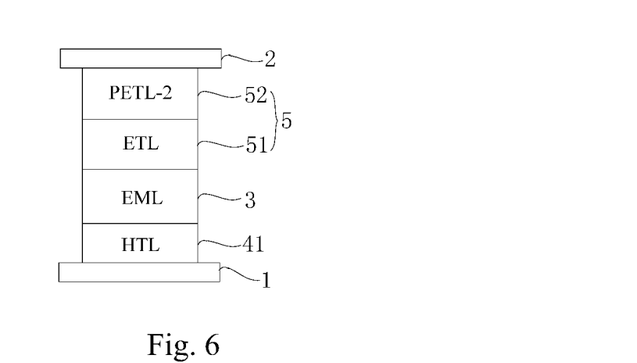
FIG. 6 is a schematic structural diagram of a fourth OLED element according to an embodiment of the disclosure.

It shall be noted that electrons can be transferred between the hole transmission material and the electron transmission material above, and the light-induced electron transfer materials, but also a hole or electron transmission component can be made of the hole transmission material and the electron transmission material to facilitate transmission of holes or electrons to the light-emitting layer for recombination, so in the OLED element according to the embodiment of the disclosure, when both the electric charge transfer and hole transmission component 4 and the electric charge transfer and electron transmission component 5 are arranged, no additional hole transmission layer or electron transmission layer will be arranged. When the OLED element is arranged with the electric charge transfer and hole transmission component 4 but not the electric charge transfer and electron transmission component 5, the electron transmission layer 51 alone can be arranged between the light-emitting layer 3 and the cathode 2 as illustrated in FIG. 5. When the OLED element is arranged with the electric charge transfer and electron transmission component 5 but not the electric charge transfer and hole transmission component 4, the hone transmission layer 41 alone can be arranged between the light-emitting layer 3 and the anode 1 as illustrated in FIG. 6.

Furthermore in the OLED element according to the embodiment of the disclosure, the materials of the anode 1, the cathode 2, the light-emitting layer 3, the hole transmission layer 41, the electron transmission layer 51, etc., can be the same as the materials of corresponding layer components in the existing OLED element. For example, the anode 1 is made of indium tin oxide (ITO), the cathode 2 is made of metal, and the light-emitting layer 3 is made of an organic light-emitting material, e.g., organic light-emitting materials capable of emitting a red light, a green light, and a blue light.

Figure 7:
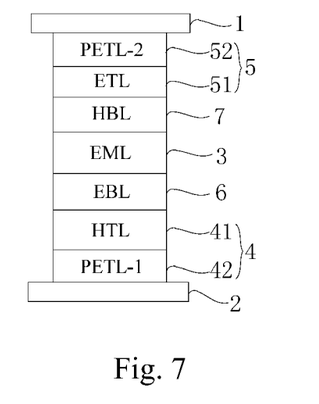
FIG. 7 is a schematic structural diagram of a fifth OLED element according to an embodiment of the disclosure.
Figure 8:
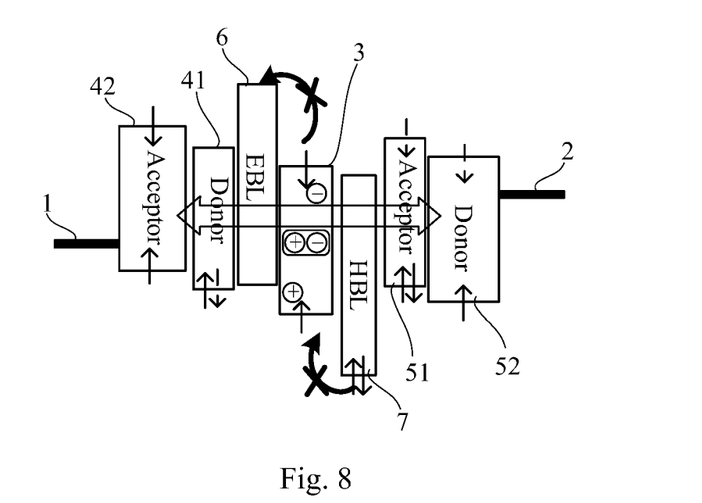
FIG. 8 is a schematic diagram of a light-emission principle of the OLED element in FIG. 7.

In some embodiments, as illustrated in FIG. 7 and FIG. 8, the OLED element according to the embodiment of the disclosure can further include at least one of an electronic barrier layer (EBL) 6 or a hole barrier layer (HBL) 7, where the electronic barrier layer 6 is located between the light-emitting layer 3 and the electric charge transfer and hole transmission component 4, and the hole barrier layer 7 is located between the light-emitting layer 3 and the electric charge transfer and electron transmission component 5.

In some embodiments, the HOMO energy level of molecules of the electronic barrier layer 6 matches with the HOMO energy level of molecules of the hole transmission material (or the hole transmission layer 41), and the LUMO energy level of the molecules of the electronic barrier layer 6 matches with the LUMO energy level of molecules of light-emitting layer 3. The LUMO energy level of molecules of the hole barrier layer 7 matches with the LUMO energy of molecules of the electron transmission material (or the electron transmission layer 51), and the HOMO energy level of the molecules of the hole barrier layer 7 matches with the HOMO energy of the molecules of the light-emitting layer 3.

As illustrated in FIG. 8, in the electric charge transfer and hole transmission component 4, holes generated as light-induced transfer of electrons shall be transmitted to the light-emitting layer (EML) 3 for recombination and light-emission, but if the LUMO energy level of the EML 3 matches with the LUMO energy level of the electron transmission material (or the electron transmission layer 51), and the electrons are transmitted rapidly, then excitons will be easily at the interface between the electric charge transfer and hole transmission component 4 and the EML 3, so there is such a narrow recombination area that may easily degrade the efficiency and the performance of the element. In the OLED element according to this embodiment, the electronic barrier layer 6 can restrain in effect the electrons in the EML 3 to thereby ensure more carriers to be recombined in the EML 3, and less excitons to be recombined at the interface, so as to improve the efficiency of the element.

In some embodiments, the hole barrier layer 7 can restrain in effect the holes in the EML 3 to thereby ensure more carriers to be recombined in the EML 3, and less excitons to be recombined at the interface, so as to improve the efficiency of the element.

A real transmission condition of carriers can be determined according to a relative difference in mobility between holes and electrons in the OLED element so that one of the electronic barrier layer 6 and the hole barrier layer 7 can be selectively added to the OLED element to thereby ensure more carriers to be recombined in the EML 3, and less excitons to be recombined at the interface, so as to improve the efficiency of the element.

Light-induced electron transfer is a common phenomenon, and natural photosynthesis is such a phenomenon, where the phenomenon occurs in a material including light capturing elements and electron donors, i.e., a light-induced electronic material with such low recombination energy in an electron transfer action that makes an application thereof promising in the fields of dye-sensitized solar cells, light-emitting materials, nonlinear optical materials, etc.

In a particular embodiment, in the OLED element according to the embodiment of the disclosure, the first light-induced electron transfer material and the second light-induced electron transfer material are photosensitive materials which are so highly sensitive to light that the light-induced electron transfer phenomenon will occur at a very low concentration, e.g., a photosensitive macromolecule compound.

Furthermore the first light-induced electron transfer material and the second light-induced electron transfer material can be a narrow band gap photosensitive material with a wide spectrum absorption range. For example, laser of the first light-induced electron transfer material and the second light-induced electron transfer material includes visible light, that is, they can be excited in the visible spectrum range 380 nm to 780 nm to transfer electric charges.

Furthermore the first molecules of the first light-induced electron transfer material and the third molecules of the second light-induced electron transfer material may include a conjugate system, and have a high carrier transmission capacity.

For example, the first light-induced electron transfer material and the second light-induced electron transfer material may be selected from at least one of benzoylimino and a derivative thereof, porphyrin and a derivative thereof, perylene and a derivative thereof, etc.

Figure 9:
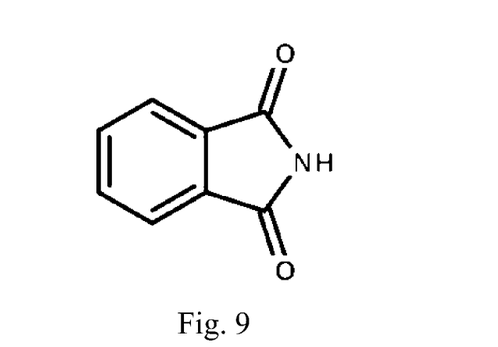
FIG. 9 is a schematic structural diagram of molecules of benzoylimino and a derivative thereof.

A benzoylimino-like compound has a conjugate molecule structure as illustrated in FIG. 9, has a high hole carrier transmission capacity, and can strongly absorb light in the blue region.

Figure 10:
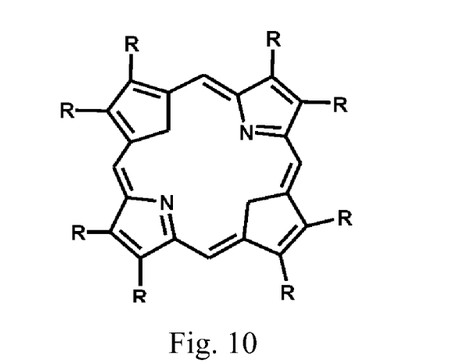
FIG. 10 is a schematic structural diagram of molecules of porphyrin and a derivative thereof.

Porphyrin is a collection of macro-cyclic compounds with a substituent group on a matrix cycle of porphin, and includes a n-plane chromogenic conjugate system formed of eighteen atoms and eighteen electrons. When hydrogen atoms in the substituent group are substituted with another group to form a porphyrin derivative with a molecule structure as illustrated in FIG. 10. Such compounds are common in the natural world, e.g., chlorophyll, hemachrome, vitamin B12, etc., all of which are closely related to vital activities, and play a significant role in electron transfer of a living body. There is a strong spectrum response of the porphyrin and metal porphyrin systems in the visible region due to a planar macro-cyclic structure, so all the porphyrin-based groups have a strong light-induced electron transfer function, that is, light-induced electron transfer can induced in the ultraviolet-visible range. For example, light-induced electron transfer can be induced between a tetrahydroxy zinc donor and an acceptor when light is incident thereon to thereby exhibit an excellent light capturing capability, and a strong light-induced electron transfer action can occur particularly when light is incident at a wavelength of 469 nm, 487 nm, 515 nm, 531 nm, 546 nm, and 570 nm.

Figure 11:
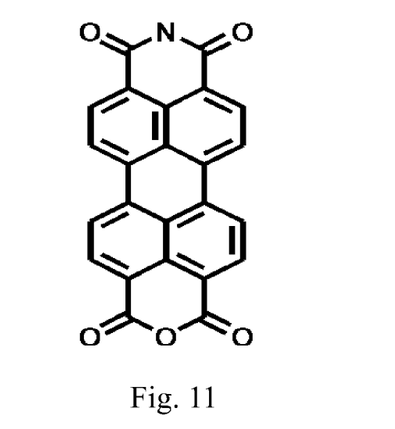
FIG. 11 is a schematic structural diagram of molecules of perylene and a derivative thereof.

A perylene bisimide-like compound is a Perylene-like derivative which is a typical n-type semiconductor with a molecule structure as illustrated in FIG. 11, and such a compound has no electron, a high fluorescent quantum productivity, an adjustable emitted light color, and other characteristics; and light-induced electron transfer can be induced under some condition to thereby improve the photoelectric conversion efficiency of the material.

An embodiment of the disclosure further provides a display panel including the OLED elements according to any one of the embodiments above of the disclosure.

In a bottom-emitting OLED display element, a cathode is typically made of aluminum (Al) with a thickness of generally approximately 100 nm, where the reflectivity of metal Al is lower than that of metal silver (Ag) by a factor of approximately 10, and if the element made of Al is relatively thin (e.g., 100 nm), then light will be seriously transmitted, thus resulting in some waste of a light source. In the display panel according to the embodiment of the disclosure, a light-induced electric charge transfer material is added between an anode and a light-emitting layer or an anode or a cathode of each OLED display element so that electric charge transfer between molecules can be induced in the light-induced electric charge transfer material and a hole or electron transmission material using light, emitted by the element itself, which is not utilized in effect, to thereby improve the concentration of carriers, and balance transmission of the carriers in the element so as to improve the light-emission brightness and efficiency, to alleviate the light-emission efficiency in the element from falling down, and to improve the light-emission performance of the OLED display panel.

Furthermore an embodiment of the disclosure further provides a display device including the display panel according to the embodiment above of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An Organic Light-Emitting Diode (OLED) element, comprising:
   an anode;
   a light-emitting layer;
   a cathode stacked; and
   at least one of following components:
   an electric charge transfer and hole transmission component located between the anode and the light-emitting layer, wherein the electric charge transfer and hole transmission component comprises a first light-induced electron transfer material and a hole transmission material, the first light-induced electron transfer material is configured to transfer first electric charges between first molecules of the first light-induced electron transfer material and second molecules of the hole transmission material upon being excited by light, the first light-induced electron transfer material comprises electron acceptors, and the hole transmission material comprises electron donors; or
   an electric charge transfer and electron transmission component located between the cathode and the light-emitting layer, wherein the electric charge transfer and electron transmission component comprises a second light-induced electron transfer material and an electron transmission material, the second light-induced electron transfer material is configured to transfer second electric charges between third molecules of the second light-induced electron transfer material and fourth molecules of the electron transmission material upon being excited by light, the second light-induced electron transfer material comprises electron donors, and the electron transmission material comprises electron acceptors;
   wherein laser of the first light-induced electron transfer material comprises visible light and
   laser of the second light-induced electron transfer material comprises visible light.

2. The OLED element according to claim 1, wherein the electric charge transfer and hole transmission component comprises a first electron transfer layer formed of the first light-induced electron transfer material, and a hole transmission layer formed of the hole transmission material, and the first electron transfer layer is located between the anode and the hole transmission layer; or
   the electric charge transfer and hole transmission component is a single-layer component formed of the first light-induced electron transfer material and the hole transmission material.

3. The OLED element according to claim 1, wherein the electric charge transfer and electron transmission component comprises a second electron transfer layer formed of the second light-induced electron transfer material, and an electron transmission layer formed of the electron transmission material, and the second electron transfer layer is located between the cathode and the electron transmission layer; or
   the electric charge transfer and electron transmission component is a single-layer component formed of the second light-induced electron transfer material and the electron transmission material.

4. The OLED element according to claim 1, wherein the first light-induced electron transfer material is a photosensitive macromolecule material; and
   the second light-induced electron transfer material is a photosensitive macromolecule material.

5. The OLED element according to claim 4, wherein the first molecules of the first light-induced electron transfer material comprise a conjugate system; and
   the third molecules of the second light-induced electron transfer material comprise a conjugate system.

6. The OLED element according to claim 1, wherein the first light-induced electron transfer material is selected from at least one of benzoylimino and a derivative thereof, porphyrin and a derivative thereof, or perylene and a derivative thereof; and
   the second light-induced electron transfer material is selected from at least one of benzoylimino and a derivative thereof, porphyrin and a derivative thereof, or perylene and a derivative thereof.

7. The OLED element according to claim 2, wherein the first light-induced electron transfer material is selected from at least one of benzoylimino and a derivative thereof, porphyrin and a derivative thereof, or perylene and a derivative thereof; and
   the second light-induced electron transfer material is selected from at least one of benzoylimino and a derivative thereof, porphyrin and a derivative thereof, or perylene and a derivative thereof.

8. The OLED element according to claim 3, wherein the first light-induced electron transfer material is selected from at least one of benzoylimino and a derivative thereof, porphyrin and a derivative thereof, or perylene and a derivative thereof; and
   the second light-induced electron transfer material is selected from at least one of benzoylimino and a derivative thereof, porphyrin and a derivative thereof, or perylene and a derivative thereof.

9. The OLED element according to claim 6, wherein the OLED element further comprises at least one of following barrier layers:
   an electronic barrier layer located between the light-emitting layer and the electric charge transfer and hole transmission component; or
   a hole barrier layer located between the light-emitting layer and the electric charge transfer and electron transmission component.

10. A display panel, comprising the OLED element according to claim 1.

11. The display panel according to claim 10, wherein the electric charge transfer and hole transmission component comprises a first electron transfer layer formed of the first light-induced electron transfer material, and a hole transmission layer formed of the hole transmission material, and the first electron transfer layer is located between the anode and the hole transmission layer; or
   the electric charge transfer and hole transmission component is a single-layer component formed of the first light-induced electron transfer material and the hole transmission material.

12. The display panel according to claim 10, wherein the electric charge transfer and electron transmission component comprises a second electron transfer layer formed of the second light-induced electron transfer material, and an electron transmission layer formed of the electron transmission material, and the second electron transfer layer is located between the cathode and the electron transmission layer; or
   the electric charge transfer and electron transmission component is a single-layer component formed of the second light-induced electron transfer material and the electron transmission material.

13. The display panel according to claim 10, wherein the first light-induced electron transfer material is a photosensitive macromolecule material; and
the second light-induced electron transfer material is a photosensitive macromolecule material.

14. The display panel according to claim 13, wherein the first molecules of the first light-induced electron transfer material comprise a conjugate system; and
the third molecules of the second light-induced electron transfer material comprise a conjugate system.

15. The display panel according to claim 10, wherein the first light-induced electron transfer material is selected from at least one of benzoylimino and a derivative thereof, porphyrin and a derivative thereof, or perylene and a derivative thereof; and
the second light-induced electron transfer material is selected from at least one of benzoylimino and a derivative thereof, porphyrin and a derivative thereof, or perylene and a derivative thereof.

16. The display panel according to claim 15, wherein the OLED element further comprises at least one of following barrier layers:
an electronic barrier layer located between the light-emitting layer and the electric charge transfer and hole transmission component; or
a hole barrier layer located between the light-emitting layer and the electric charge transfer and electron transmission component.

17. A display device, comprising the display panel according to claim 10.

18. An Organic Light-Emitting Diode (OLED) element, comprising:
an anode;
a light-emitting layer;
a cathode stacked; and
at least one of following components:
an electric charge transfer and hole transmission component located between the anode and the light-emitting layer, wherein the electric charge transfer and hole transmission component comprises a first light-induced electron transfer material and a hole transmission material, the first light-induced electron transfer material is configured to transfer first electric charges between first molecules of the first light-induced electron transfer material and second molecules of the hole transmission material upon being excited by light, the first light-induced electron transfer material comprises electron acceptors, and the hole transmission material comprises electron donors; or an electric charge transfer and electron transmission component located between the cathode and the light-emitting layer, wherein the electric charge transfer and electron transmission component comprises a second light-induced electron transfer material and an electron transmission material, the second light-induced electron transfer material is configured to transfer second electric charges between third molecules of the second light-induced electron transfer material and fourth molecules of the electron transmission material upon being excited by light, the second light-induced electron transfer material comprises electron donors, and the electron transmission material comprises electron acceptors;

wherein the electric charge transfer and hole transmission component comprises a first electron transfer layer formed of the first light-induced electron transfer material, and a hole transmission layer formed of the hole transmission material, and the first electron transfer layer is located between the anode and the hole transmission layer; or the electric charge transfer and hole transmission component is a single-layer component formed of the first light-induced electron transfer material and the hole transmission material.

* * * * *